(12) United States Patent
Kim et al.

(10) Patent No.: US 11,177,340 B2
(45) Date of Patent: Nov. 16, 2021

(54) DISPLAY DEVICE AND METHOD FOR MANUFACTURING THE SAME

(71) Applicant: SAMSUNG DISPLAY CO., LTD., Yongin-si (KR)

(72) Inventors: Jin-Yup Kim, Cheonan-si (KR); Deukjong Kim, Cheonan-si (KR); Hagyeong Song, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/917,978

(22) Filed: Jul. 1, 2020

(65) Prior Publication Data
US 2021/0043712 A1    Feb. 11, 2021

(30) Foreign Application Priority Data
Aug. 8, 2019   (KR) .......................... 10-2019-0096979

(51) Int. Cl.
| | |
|---|---|
| *H01L 27/32* | (2006.01) |
| *H01L 51/52* | (2006.01) |
| *H01L 51/56* | (2006.01) |
| *G06F 3/041* | (2006.01) |

(52) U.S. Cl.
CPC .......... *H01L 27/3276* (2013.01); *G06F 3/041* (2013.01); *H01L 27/323* (2013.01); *H01L 51/5253* (2013.01); *H01L 51/56* (2013.01); *G06F 2203/04103* (2013.01); *H01L 2227/323* (2013.01)

(58) Field of Classification Search
CPC ............... H01L 27/3276; H01L 27/323; H01L 51/5253; H01L 51/56; G06F 3/041; G06F 3/044
See application file for complete search history.

(56) References Cited

U.S. PATENT DOCUMENTS

| | | | |
|---|---|---|---|
| 7,838,880 B2* | 11/2010 | Kwak | H01L 27/124 257/59 |
| 10,566,395 B2* | 2/2020 | Lee | G06F 3/0443 |
| 2016/0351651 A1* | 12/2016 | Jang | H01L 27/3276 |
| 2017/0141176 A1* | 5/2017 | Im | H01L 51/5228 |
| 2017/0345882 A1* | 11/2017 | Nam | H01L 27/3246 |
| 2017/0358642 A1* | 12/2017 | Jo | H01L 27/3276 |

FOREIGN PATENT DOCUMENTS

KR    10-2017-0079901    7/2017

* cited by examiner

*Primary Examiner* — Sardis F Azongha
(74) *Attorney, Agent, or Firm* — F. Chau & Associates, LLC

(57) ABSTRACT

A display device includes a light-emitting element disposed in a display area. A connection pad is disposed in a bonding area of a non-display area. The connection pad includes a lower conductive layer, an intermediate conductive layer disposed on the lower conductive layer and an upper conductive layer disposed on the intermediate conductive layer. A lower surface of the upper conductive layer directly contacts an upper surface of the intermediate conductive layer without an intermediate member disposed therebetween.

21 Claims, 11 Drawing Sheets

DISPLAY DEVICE AND METHOD FOR MANUFACTURING THE SAME

CROSS-REFERENCE TO RELATED APPLICATION

This application claims priority under 35 U.S.C. § 119 to Korean Patent Application No. 10-2019-0096979, filed on Aug. 8, 2019 in the Korean Intellectual Property Office, the disclosure of which is incorporated by reference in its entirety herein.

1. Technical Field

Exemplary embodiments relate to a display device. More particularly, exemplary embodiments relate to a display device and a method for manufacturing a display device.

2. Discussion of Related Art

An organic light-emitting display device emits light without requiring a backlight or a separate light source. Therefore, an organic light-emitting display device may have a reduced weight and thickness as compared to other display devices. The usage of organic light-emitting display devices for display devices, such as flexible display devices, has increased due to these characteristics.

The organic light-emitting display device includes an array of light-emitting elements and a driving part for providing a driving signal to the light-emitting elements. A driving circuit of the driving part may be disposed in a driving chip. The driving chip (or a circuit board combined with the driving chip) may be combined with a substrate of the organic light-emitting display device.

The driving chip may be bonded to the substrate by hot pressing or the like. However, the bonding process may cause bonding defects which reduce the reliability of the display device.

SUMMARY

Exemplary embodiments provide a display device with improved reliability.

Exemplary embodiments provide a method for manufacturing a display device.

According to an exemplary embodiment, a display device includes a light-emitting element disposed in a display area. A connection pad is disposed in a bonding area of a non-display area. The connection pad includes a lower conductive layer, an intermediate conductive layer disposed on the lower conductive layer and an upper conductive layer disposed on the intermediate conductive layer. A lower surface of the upper conductive layer directly contacts an upper surface of the intermediate conductive layer without an intermediate member disposed therebetween.

In an exemplary embodiment, the display device further includes a driving element electrically connected to the light-emitting element, an encapsulation layer covering the light-emitting element and a touch-sensing part disposed on the encapsulation layer, the touch-sensing part including a sensing conductive pattern. The driving element includes a gate metal pattern including a gate electrode, and a source metal pattern, which includes a drain electrode or a connection electrode electrically connecting the drain electrode to the light-emitting element.

In an exemplary embodiment, the lower conductive layer is disposed in a same layer as the gate metal pattern, the intermediate conductive layer disposed in a same layer as the source metal pattern, and the upper conductive layer is disposed in a same layer as the sensing conductive pattern.

In an exemplary embodiment, the source metal pattern includes a first source metal pattern including the drain electrode, and a second source metal pattern including the connection electrode. The intermediate conductive layer includes a first intermediate conductive layer disposed in a same layer as the first source metal pattern, and a second intermediate conductive layer disposed in a same layer as the second source metal pattern.

In an exemplary embodiment, the display device includes an encapsulation layer covering the light-emitting element and a touch-sensing part disposed on the encapsulation layer. The touch-sensing part includes a first sensing conductive pattern, a touch intermediate insulation layer covering the first sensing conductive pattern, and a second sensing conductive pattern disposed on the touch intermediate insulation layer. The upper conductive layer is disposed in a same layer as the second sensing conductive pattern.

In an exemplary embodiment, the upper conductive layer covers an upper surface and a side surface of the intermediate conductive layer.

In an exemplary embodiment, an entire lower surface of the upper conductive layer contacts the intermediate conductive layer.

In an exemplary embodiment, the intermediate conductive layer includes an aluminum layer and a titanium layer disposed on the aluminum layer.

In an exemplary embodiment, a first electrode of the light-emitting element includes silver.

In an exemplary embodiment, the connection pad is electrically connected to the driving part through a conductive bonding member.

According to an exemplary embodiment, a method for manufacturing a display device includes forming a light-emitting element disposed in a display area, a driving element electrically connected to the light-emitting element and an encapsulation layer covering the light-emitting element. A lower conductive layer of a connection pad is formed in a bonding area of a non-display area. An intermediate conductive layer of the connection pad is formed. The intermediate conductive layer is electrically connected to the lower conductive layer. A cladding layer is formed that covers a side surface of the intermediate conductive layer and exposes an upper surface of the intermediate conductive layer. The cladding layer is removed after the light-emitting element and the encapsulation layer are formed.

According to an exemplary embodiment, a display device includes a light-emitting element disposed in a display area. A connection pad is disposed in a bonding area of a non-display area. The connection pad includes a lower conductive layer, a first intermediate conductive layer disposed on the lower conductive layer, a second intermediate conductive layer disposed on the first intermediate conductive layer and an upper conductive layer disposed on the intermediate conductive layer. A lower surface of the second intermediate conductive layer directly contacts and covers an upper surface and side surfaces of the first intermediate conductive layer. A lower surface of the upper conductive layer directly contacts and covers an upper surface and side surfaces of the second intermediate conductive layer.

According to the exemplary embodiments, a cladding layer is formed in a bonding area to prevent exposure of a conductive layer including aluminum. Thus, particles due to reduction of metal ions may be prevented. Furthermore, the cladding layer includes an organic material, which is susceptible to heat and moisture, is removed in the process of forming a touch-sensing part before a bonding process. Thus, a bonding failure may be prevented, and a reliability of a display device may be improved.

BRIEF DESCRIPTION OF THE DRAWINGS

Aspects of one or more exemplary embodiments of the present inventive concept will be more clearly understood from the following detailed description taken in conjunction with the accompanying drawings.

DETAILED DESCRIPTION OF EXEMPLARY EMBODIMENTS

A display device and a method for manufacturing a display device according to exemplary embodiments of the present inventive concepts will be described hereinafter with reference to the accompanying drawings, in which some exemplary embodiments are shown.

Figure 1:
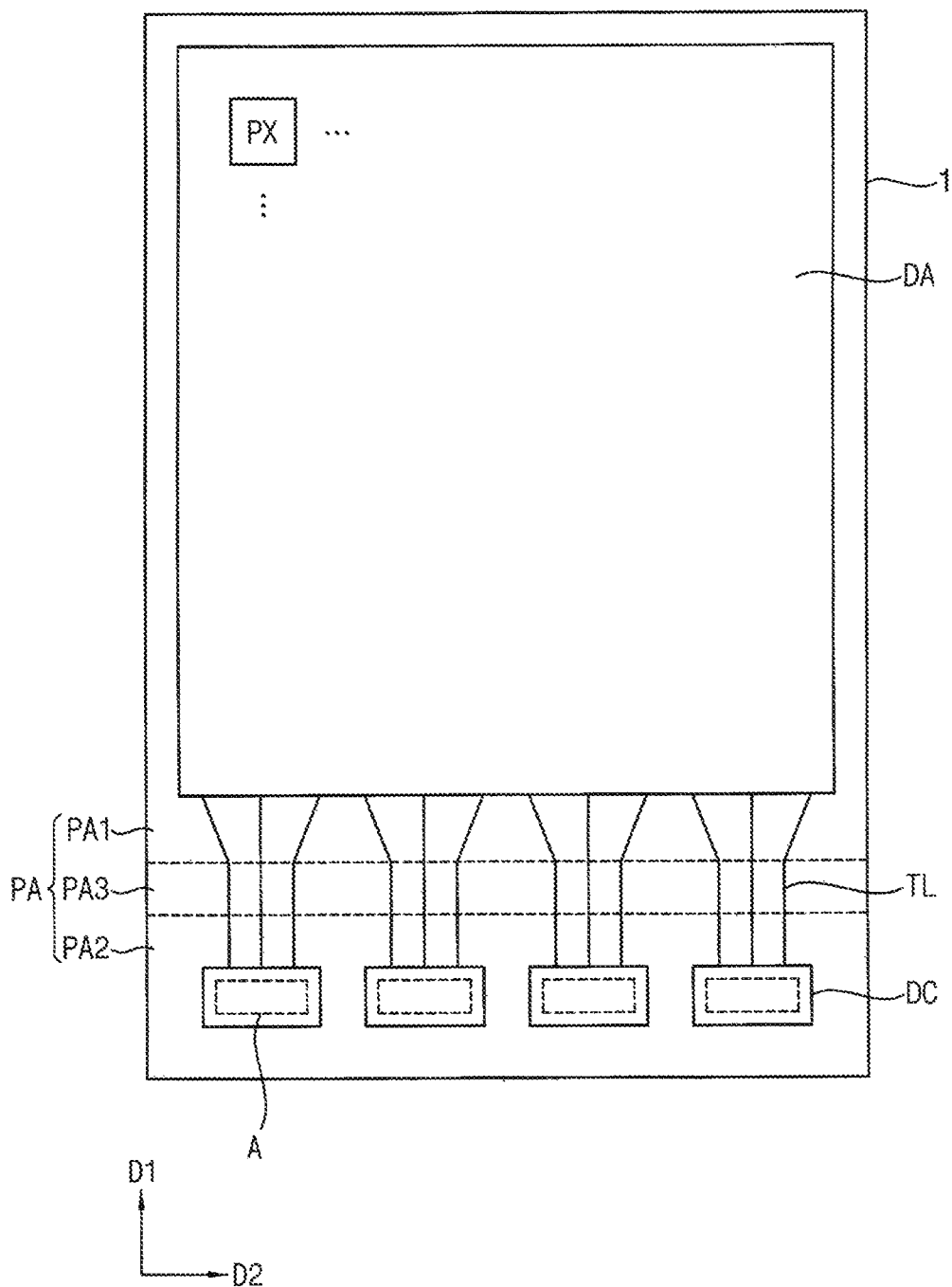
FIG. 1 is a top plan view illustrating a display device according to an exemplary embodiment of the present inventive concepts.
Figure 2:
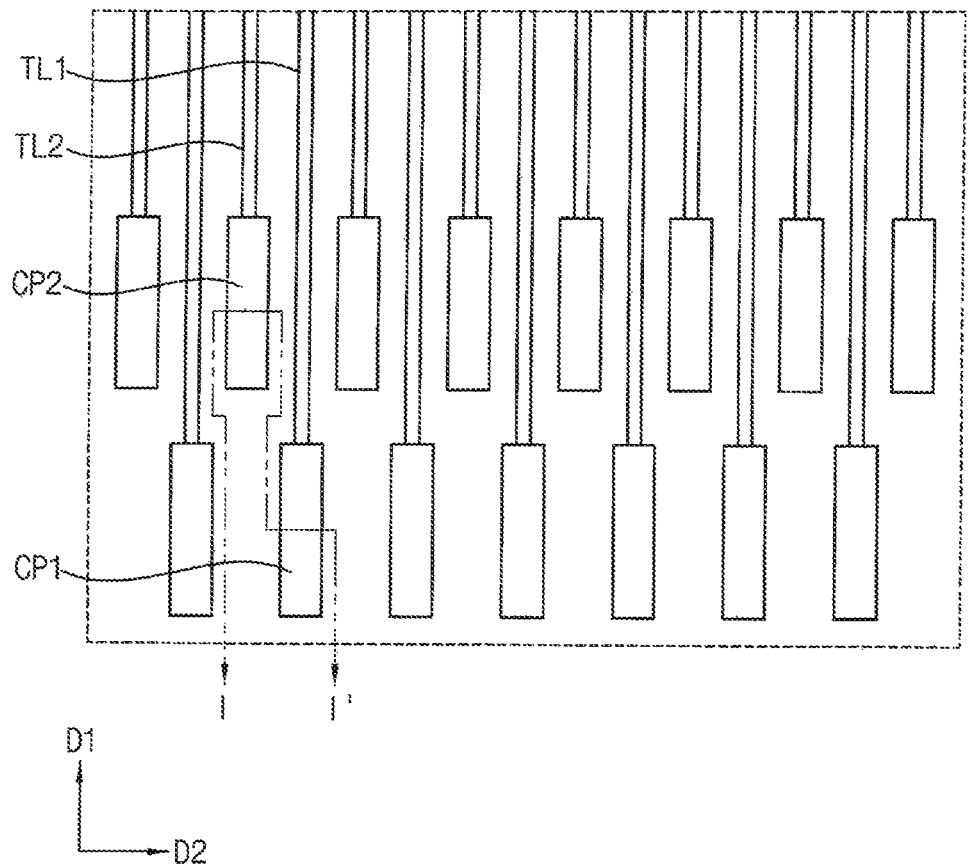
FIG. 2 is an enlarged top plan view illustrating the region A of FIG. 1 according to an exemplary embodiment of the present inventive concepts.

FIG. 1 is a top plan view illustrating a display device according to an exemplary embodiment of the present inventive concepts. FIG. 2 is an enlarged plan view illustrating the region A of FIG. 1 according to an exemplary embodiment of the present inventive concepts.

Referring to FIG. 1, a display device 1 includes a display area DA and a non-display area PA.

An array of pixels PX which emits a light to display an image may be disposed in the display area DA. For convenience of explanation, the exemplary embodiment of FIG. 1 only shows a single specific pixel PX. However, the array of pixels PX includes a plurality of pixels that may be configured in a variety of different arrangements. In an exemplary embodiment, the display device 1 may be an organic light-emitting display device. However, exemplary embodiments of the present inventive concepts are not limited thereto. Each of the pixels PX may include an organic light-emitting diode and a driving element for driving the organic light-emitting diode. The driving element may include at least one thin film transistor. The display device 1 may further include an encapsulation layer that protects the organic light-emitting diode and a touch-sensing part disposed on the encapsulation layer.

In the exemplary embodiment shown in FIG. 1, the display area DA is shown as having a rectangular shape with relatively longer sides extending in the first direction D1 and relatively shorter sides extending in the second direction D2. However, in other exemplary embodiments, the display area DA may have a variety of different shapes. The non-display area PA may include a peripheral area PA1 adjacent to or surrounding the display area DA and a bonding area PA2. In the exemplary embodiment shown in FIG. 1, the peripheral area PA1 may surround four sides of the display area DA (e.g., in the first direction D1 and/or second direction D2). However, in other exemplary embodiments, the peripheral area PA1 may surround three or less sides of the display area DA. As shown in the exemplary embodiment of FIG. 1, the bonding area PA2 may be disposed below the peripheral area PA1 (e.g., in the first direction D1).

The driving part DC may provide a driving signal such as a data signal to the pixel array of the display area DA. In an exemplary embodiment, the driving part DC may include a driving chip including an integrated circuit. The driving signal generated by the driving part DC may be provided to the pixel array of the display area DA through a transfer line TL that extends from the driving part DC to the display area DA. For example, the transfer line TL may extend along a first direction D1. However, exemplary embodiments of the present inventive concepts are not limited thereto.

In an exemplary embodiment, the display device 1 may have a folded shape or a bent shape. For example, as shown in the exemplary embodiment of FIG. 1, the display device 1 may include a bending area PA3 that is between the peripheral area PA1 and the bonding area PA2 (e.g., in the first direction D1). The bending area PA3 may be bent to have a curvature which permits the bonding area PA2 to be disposed under the display area DA.

A connection pad electrically connected to the driving part DC is disposed in the bonding area PA2. For example, in an exemplary embodiment, a plurality of connection pads may be arranged with a zigzag configuration along a second direction D2 crossing the first direction D1. For example, as shown in the exemplary embodiment of FIG. 2, a plurality of first connection pads CP1 electrically connected to first transfer lines TL1 may be spaced apart in the second direction D2 in a first row, and second connection pads CP2 electrically connected to second transfer lines TL2 may be spaced apart in the second direction D2 in a second row. The second row is spaced apart from the first row in the first direction D1.

In an exemplary embodiment, the first and second connection pads CP1 and CP2 may respectively have a multi-layered structure including a plurality of conductive layers. For example, the first and second connection pads CP1 and CP2 may include a combination of conductive layers formed from the same layers as at least two of a gate metal pattern of the driving element, a source metal pattern of the driving element and a sensing conductive pattern of the touch-sensing part.

FIGS. 3 to 17 are cross-sectional views illustrating a method for manufacturing a display device according to exemplary embodiments of the present inventive concepts. FIGS. 3, 5, 7, 10, 12 and 15 may illustrate the display area DA, and FIGS. 4, 6, 8, 11, 13, 14, 16 and 17 may illustrate the bonding area PA2 taken along line I-I' of FIG. 2. FIG. 9 may illustrate the enlarged region 'B' of FIG. 8.

Figure 3:
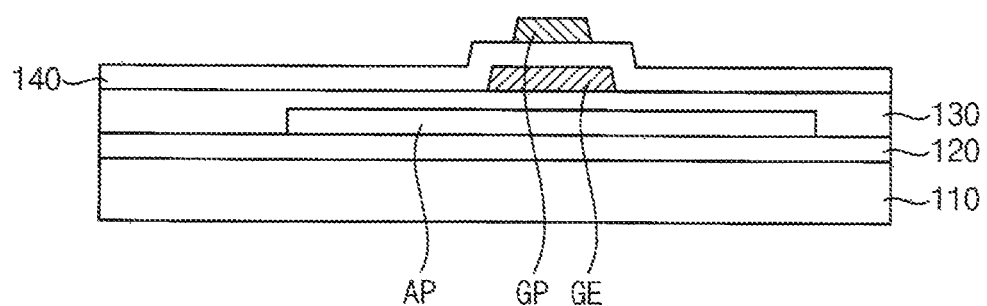
FIGS. 3, 5, 7, 10, 12 and 15 are cross-sectional views illustrating a display area of the display device for a method for manufacturing a display device according to exemplary embodiments of the present inventive concepts.

Referring to FIG. 3, a buffer layer 120 is formed on a base substrate 110 in the display area DA. For example, as shown in the exemplary embodiment of FIG. 3, a bottom surface of the buffer layer 120 may be disposed directly on a top surface of the base substrate 110.

In an exemplary embodiment, the base substrate 110 may include glass, quartz, silicon, a polymeric material, etc. However, exemplary embodiments of the present inventive concepts are not limited thereto. For example, the base substrate 110 may be a flexible substrate including the polymeric material. In an exemplary embodiment, the polymeric material may include polyethylene terephthalate, polyethylene naphthalate, polyether ketone, polycarbonate, polyarylate, polyether sulfone, polyimide or a combination thereof.

The buffer layer 120 may prevent or reduce penetration of impurities, humidity or external gas from underneath of the base substrate 110, and may planarize an upper surface of the base substrate 110. For example, the buffer layer 120 may include an inorganic material such as silicon oxide, silicon nitride or the like, or a combination thereof.

An active pattern AP is formed on the buffer layer 120. For example, as shown in the exemplary embodiment of FIG. 3, a bottom surface of the active pattern AP may be formed directly on a top surface of the buffer layer 120.

In an exemplary embodiment, the active pattern AP may include a semiconductive material such as amorphous silicon, polycrystalline silicon (polysilicon), a metal oxide, etc. In embodiments in which the active pattern AP may include polysilicon, at least a portion of the active pattern AP may be doped with impurities such as n-type impurities or p-type impurities.

In another exemplary embodiment, the active pattern AP may include a metal oxide semiconductor. For example, the active pattern may include a two-component compound (ABx), a ternary compound (ABxCy) or a four-component compound (ABxCyDz), which includes compounds selected from indium (In), zinc (Zn), gallium (Ga), tin (Sn), titanium (Ti), aluminum (Al), hafnium (Hf), zirconium (Zr) and magnesium (Mg). For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), etc.

A first insulation layer 130 is formed on the active pattern AP. For example, as shown in the exemplary embodiment of FIG. 3, the first insulation layer 130 may be disposed directly on top and side surfaces of the active pattern AP. A first gate metal pattern including a gate electrode GE is formed on the first insulation layer 130. A bottom surface of the gate electrode GE may be formed directly on a top surface of the first insulation layer 130. The gate electrode GE overlaps the active pattern AP (e.g., in the thickness direction of the base substrate 110). A second insulation layer 140 is formed to cover the first gate metal pattern. For example, as shown in the exemplary embodiment of FIG. 3, the second insulation layer 140 may be disposed directly on top and side surfaces of the gate electrode GE and a top surface of the first insulation layer 130. A second gate metal pattern including a gate wiring pattern GP is formed on the second insulation layer 140. For example, as shown in the exemplary embodiment of FIG. 3, a bottom surface of the gate wiring pattern GP may be formed directly on a top surface of the second insulating layer 140. In an exemplary embodiment, the gate wiring pattern GP may include a capacitor electrode, a signal wiring for transferring a driving signal, etc.

In an exemplary embodiment, the first insulation layer 130 and the second insulation layer 140 may respectively include at least one compound selected from silicon oxide, silicon nitride, silicon carbide or a combination thereof. Furthermore, the first insulation layer 130 and the second insulation layer 140 may include an insulating metal oxide such as aluminum oxide, tantalum oxide, hafnium oxide, zirconium oxide, titanium oxide, etc. For example, the first insulation layer 130 and the second insulation layer 140 may respectively have a single-layered structure or a multi-layered structure, which may silicon nitride and/or silicon oxide.

For example, the first gate metal pattern and the second gate metal pattern may respectively include at least one compound selected from gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

Figure 4:
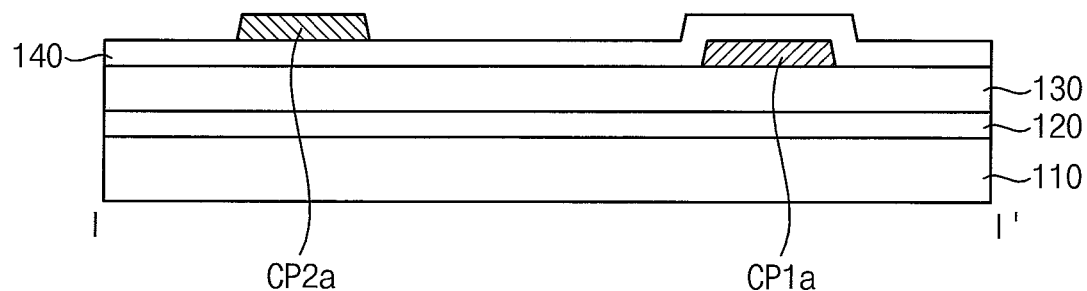
FIGS. 4, 6, 8, 11, 13, 14, 16 and 17 are cross-sectional views illustrating a bonding area of the display device taken along line I-I' of FIG. 2 for a method for manufacturing a display device according to exemplary embodiments of the present inventive concepts.

Referring to FIG. 4, a lower conductive layer of a connection pad in the bonding area PA2 is shown.

In an exemplary embodiment, a lower conductive layer CP1a of a first connection pad may be formed from a same layer as the gate electrode GE, and a lower conductive layer CP2a of a second connection pad may be formed from a same layer as the gate wiring pattern GP. As shown in the exemplary embodiment of FIG. 4, a bottom surface of the lower conductive layer CP1a of the first connection pad may be disposed directly on a top surface of the first insulation layer 130. The second insulation layer 140 may be disposed directly on top and side surfaces of the lower conductive layer CP1a of the first connection pad and on a top surface of the first insulation layer 130. The lower conductive layer CP1a of the first connection pad is disposed between the first insulation layer 130 and the second insulation layer 140. The lower conductive layer CP2a of the second connection pad may be disposed on the second insulation layer 140. For example, as shown in the exemplary embodiment of FIG. 4, a bottom surface of the lower conductive layer CP2a of the second connection pad may be formed directly on a top surface of the second insulation layer 140.

Furthermore, the transfer lines TL1 and TL2 illustrated in FIG. 2 may be formed from the same layers as the gate electrode GE and the gate wiring pattern GP, respectively, and may be continuously connected to corresponding lower conductive layers CP1a and CP2a. However, in an exemplary embodiment, at least a portion of the transfer lines TL1 and TL2 may be formed from a layer different from the gate electrode GE and the gate wiring pattern GP. For example, the transfer lines TL1 and TL2 may include a bridge formed from a same layer as a source metal pattern.

Figure 5:
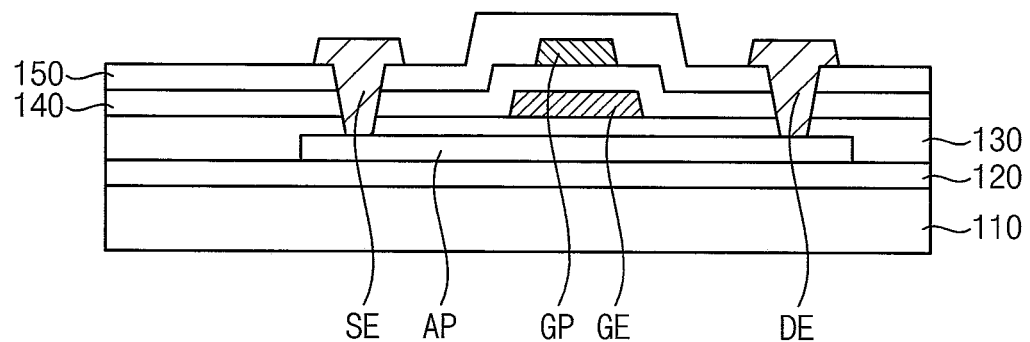

Referring to FIG. 5, a third insulation layer 150 is formed in the display area DA to cover the second gate metal pattern, such as the gate wiring pattern GP. As shown in the exemplary embodiment of FIG. 5, a bottom surface of the third insulation layer 150 may directly contact top and side surfaces of the gate wiring pattern GP and top surfaces of the second insulation layer 140. Thereafter, a first source metal pattern is formed on the third insulation layer 150. As shown in the exemplary embodiment of FIG. 5, the first source metal pattern may include a source electrode SE and a drain electrode DE, which are electrically connected to the active pattern AP, respectively. For example, the source electrode SE and the drain electrode DE may be formed directly on the top surface of the third insulation layer 150. The source electrode SE and the drain electrode DE may respectively pass through the third insulation layer 150, the second insulation layer 140 and the first insulation layer 130 to contact the active pattern AP for electrical connection thereto.

Figure 6:
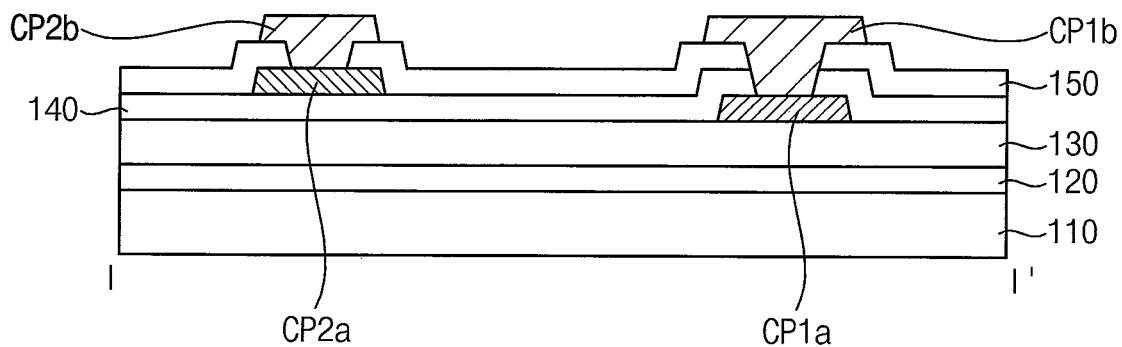

Referring to FIG. 6, a first intermediate conductive layer of the connection pads is formed in the bonding area PA2.

In an exemplary embodiment, a first intermediate conductive layer CP1b of the first connection pad and a first intermediate conductive layer CP2b of the second connection pad and may be formed from a same layer as the source electrode SE and the drain electrode DE. Thus, the first intermediate conductive layer CP1b of the first connection pad and the first intermediate conductive layer CP2b of the second connection pad may be disposed on the third insulation layer 150. For example, the first intermediate conductive layer CP1b of the first connection pad and the first intermediate conductive layer CP2b of the second connection pad may be disposed directly on a top surface of the third insulation layer 150. The first intermediate conductive layer CP1b of the first connection pad may pass through the third insulation layer 150 and the second insulation layer 140 to contact the lower conductive layer CP1a for electrical connection thereto. The first intermediate conductive layer CP2b of the second connection pad may pass through the third insulation layer 150 to contact the lower conductive layer CP2a for electrical connection thereto.

Figure 7:
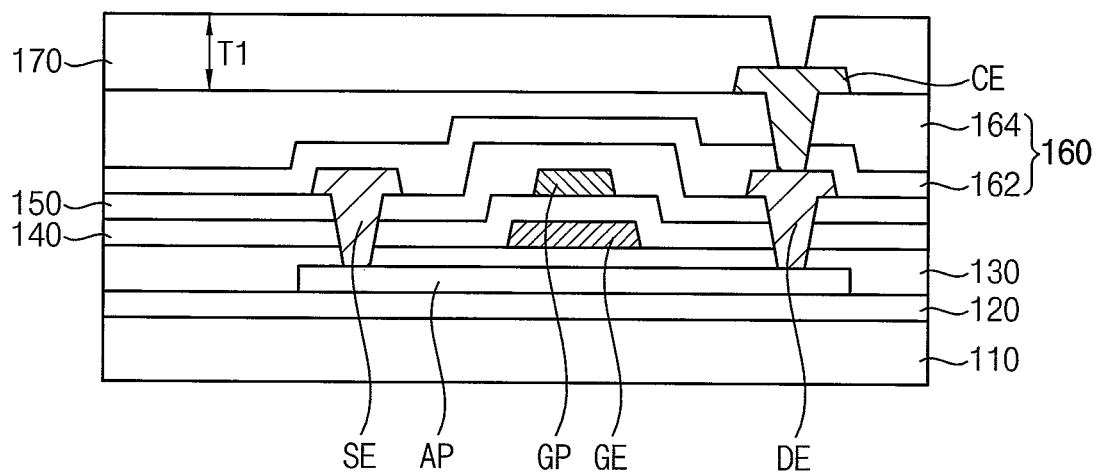

Referring to FIG. 7, a fourth insulation layer 160 is formed to cover the first source metal pattern. In an exemplary embodiment, the fourth insulation layer 160 may include an inorganic layer 162 that directly contacts the first source metal pattern and an organic layer 164 disposed on the inorganic layer 162.

A second source metal pattern is formed on the fourth insulation layer 160. The second source metal pattern may include a connection electrode CE electrically connected to the drain electrode DE. For example, as shown in the exemplary embodiment of FIG. 7, the connection electrode CE may be formed directly on the top surface of the organic layer 164 of the fourth insulating layer 160. The connection electrode CE may pass through the fourth insulation layer 160 to contact the drain electrode DE for electrical connection thereto. The second source metal pattern may further include a mesh power line to compensate for a voltage drop of a current applied to an organic light-emitting diode.

A fifth insulation layer 170 is formed to cover the second source metal pattern. For example, as shown in the exemplary embodiment of FIG. 7, the fifth insulation layer 170 may be formed directly on the top and side surfaces of the connection electrode CE and on top surfaces of the fourth insulation layer 160 (e.g., a top surface of the organic layer 164). The fifth insulation layer 170 may include an opening exposing at least a portion of an upper surface of the connection electrode CE.

In an exemplary embodiment, the first source metal pattern and the second source metal pattern may include at least one compound selected from gold, silver, aluminum, copper, nickel, platinum, magnesium, chromium, tungsten, molybdenum, titanium, tantalum or an alloy thereof, and may have a single-layered structure or a multi-layered structure including different metal layers. In an exemplary embodiment, the first source metal pattern and the second source metal pattern may include at least one layer that includes aluminum or aluminum alloy. For example, the first source metal pattern and the second source metal pattern may respectively have a bi-layered structure of titanium/aluminum or a triple-layered structure of titanium/aluminum/titanium.

For example, the third insulation layer 150 and the inorganic layer 162 of the fourth insulation layer 160 may respectively include at least one compound selected from silicon oxide, silicon nitride, silicon carbide or a combination thereof. Furthermore, the third insulation layer 150 and the inorganic layer 162 of the fourth insulation layer 160 may include an insulating metal oxide such as aluminum oxide, tantalum oxide, hafnium oxide, zirconium oxide, titanium oxide, etc. For example, the third insulation layer 150 and the inorganic layer 162 of the fourth insulation layer 160 may respectively have a single-layered structure or a multi-layered structure, which may silicon nitride and/or silicon oxide.

In an exemplary embodiment, the fifth insulation layer 170 and the organic layer 164 of the fourth insulation layer 160 may include an organic insulation material such as a phenol resin, an acryl resin, a polyimide resin, a polyamide resin, an epoxy resin, benzocyclobutene, etc.

Figure 8:
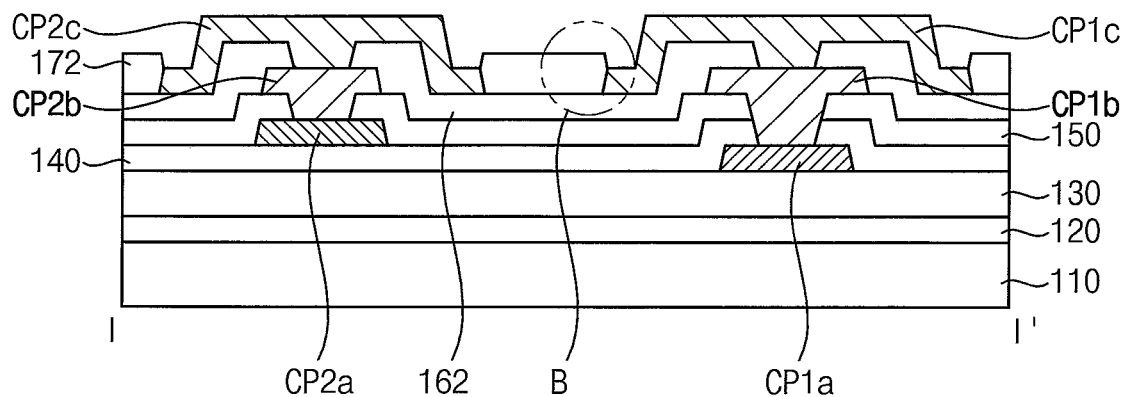
Figure 9:
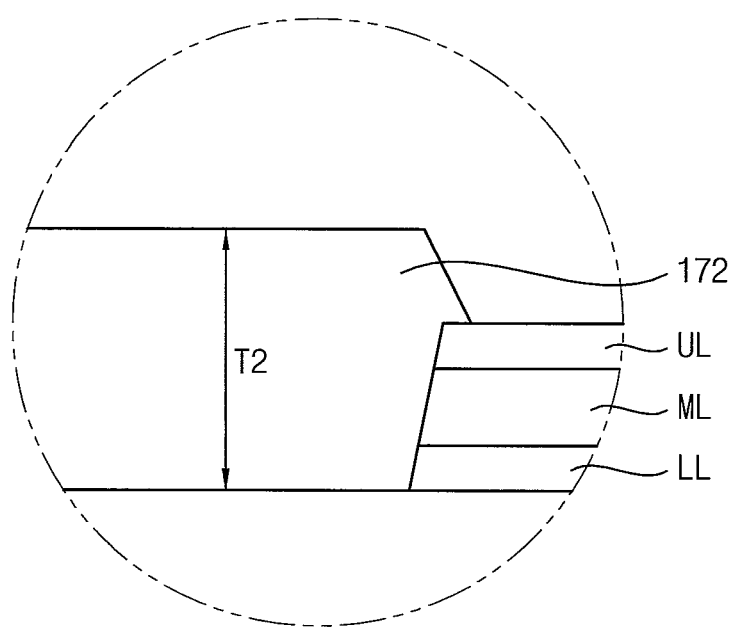
FIG. 9 is an enlarged cross-sectional view illustrating the region B of FIG. 7 according to an exemplary embodiment of the present inventive concepts.

Referring to FIG. 8, a second intermediate conductive layer of the connection pads is formed in the bonding area PA2.

In an exemplary embodiment, a fourth insulation layer formed on the first intermediate conductive layers CP1b and CP2b of the first and second connection pads may include an inorganic layer 162 without an organic layer. For example, in an exemplary embodiment, an organic layer of the fourth insulation layer may be initially formed in the bonding area PA2 and may be entirely removed during the process of patterning the organic layer 164 in the display area DA.

The second intermediate conductive layer CP1c of the first connection pad and the second intermediate conductive layer CP2c of the second connection pad may be formed on the inorganic layer 162, and may pass through the inorganic layer 162 to electrically contact the first intermediate conductive layers CP1b and CP2b, respectively. In an exemplary embodiment, the second intermediate conductive layers CP1c and CP2c of the first connection pad and second connection pads may be formed from a same layer as the connection electrode CE.

A cladding layer 172 is formed in the bonding area PA2 to cover at least a portion of the second intermediate conductive layers CP1c and CP2c of the first and second connection pads. In an exemplary embodiment, the cladding layer 172 may be formed from a same layer as the fifth insulation layer 170 formed in the display area DA.

Referring to FIG. 9, the second intermediate conductive layers CP1c and CP2c of the first and second connection pads may respectively include an upper layer UL, an intermediate layer ML and a lower layer LL. As shown in the exemplary embodiment of FIG. 9, bottom surface of the intermediate layer ML may be disposed directly on a top surface of the lower layer LL. A bottom surface of the upper layer UL may be disposed directly on a top surface of the intermediate layer ML. In an exemplary embodiment, the upper layer UL and the lower layer LL may include a metal having a relatively small ionization tendency, such as titanium, etc. In an exemplary embodiment, the intermediate layer ML may include a metal having a relatively large ionization tendency, for example, aluminum. However, exemplary embodiments of the present inventive concepts are not limited thereto.

The cladding layer 172 covers at least a side surface of the second intermediate conductive layers CP1c and CP2c of the first and second connection pads. For example, as shown in the exemplary embodiment of FIG. 9, the cladding layer 172 covers the lateral sides of the upper layer UL, intermediate layer ML and lower layer LL and a portion of the upper surface of the upper layer UL. Thus, at least a portion of an upper surface of the upper layer UL is exposed without being covered by the cladding layer 172. However, the intermediate layer ML is covered by the cladding layer 172, the upper layer UL and the lower layer LL and is not exposed. The lower layer LL is covered by the cladding layer 172 and the intermediate layer ML and is not exposed. In other exemplary embodiments, the cladding layer 172 may not cover the upper surface of the upper layer UL.

In an exemplary embodiment, a thickness T2 of the cladding layer 172 may be smaller than a thickness T1 of the fifth insulation layer 170. Therefore, the cladding layer 172 having a smaller thickness may be removed by a process such as ashing or the like for a relatively shorter time. Accordingly, damage to other elements may be minimized or prevented. In an exemplary embodiment, the thickness T2 of the cladding layer 172 may be equal to or less than 1 μm. However, exemplary embodiments of the present inventive concepts are not limited thereto. For example, in another exemplary embodiment, the thickness T2 of the cladding layer may be in a range of about 0.70 μm to about 1 μm.

In an exemplary embodiment, the fifth insulation layer 170 and the cladding layer 172 may be formed by a photolithography process using half-tone light exposure. However, exemplary embodiments of the present inventive concepts are not limited thereto.

For example, a photoresist composition is coated in the display area DA and in the bonding area PA2, and exposed to a light in a manner such that the amount of light exposure for an area corresponding to the fifth insulation layer 170 is different from the amount of light exposure for an area corresponding to the cladding layer 172. Therefore, the fifth insulation layer 170 and the cladding layer 172 having different thicknesses from each other may be formed in a same process.

Figure 10:
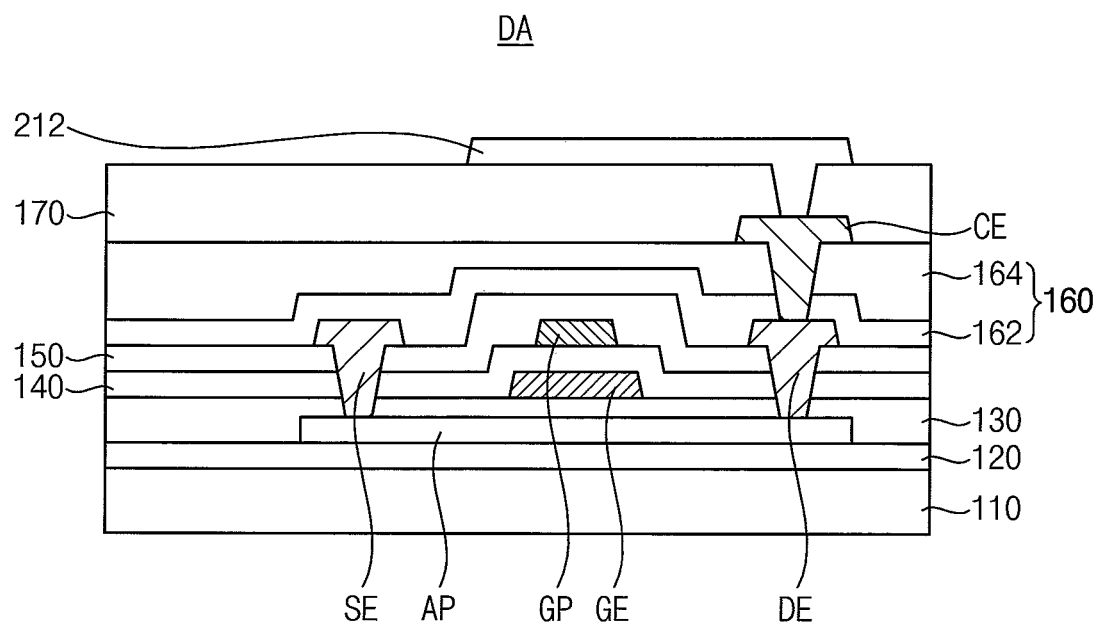
Figure 11:
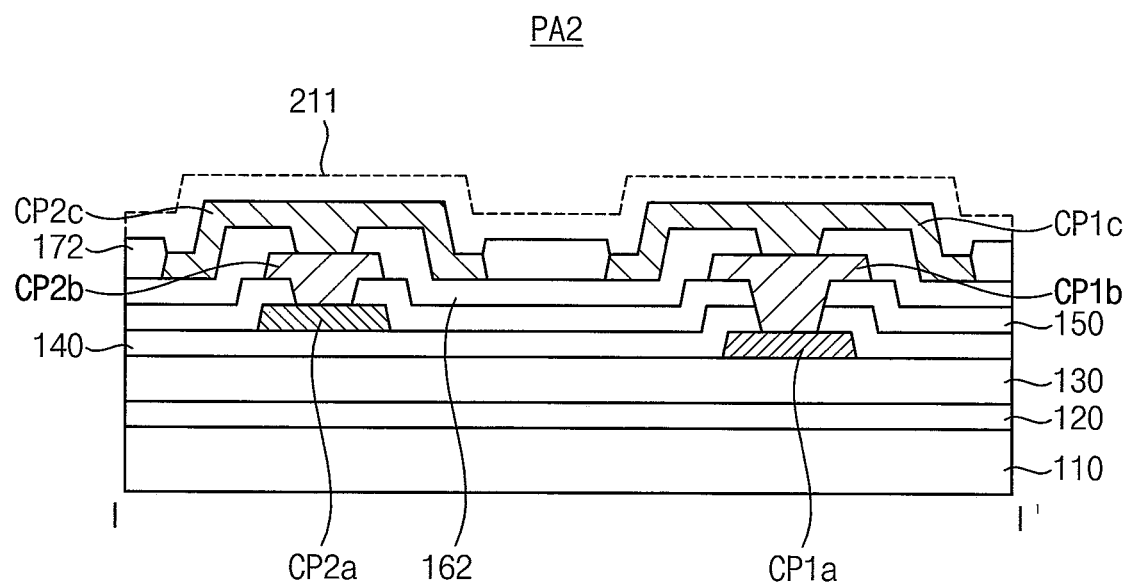

Referring to FIGS. 10 and 11, a lower electrode layer is formed on the fifth insulation layer 170 and the cladding layer 172, and patterned to form a first electrode 212 of a light-emitting diode in the display area DA. As shown in the exemplary embodiment of FIG. 10, the first electrode 212 may be disposed directly on a top surface of the fifth insulation layer 170 and may pass through the fifth insulation layer 170 to contact the connection electrode CE for electrical connection thereto. As shown in the exemplary embodiment of FIG. 11, the lower electrode layer 211 may be entirely removed in the bonding area PA2 as indicated by the broken lines in FIG. 11 representing the removed lower electrode layer 211.

In an exemplary embodiment, the lower electrode layer 211 may have a multi-layered structure including a metal oxide layer and a metal layer. The metal oxide layer may include at least one compound selected from indium tin oxide, indium zinc oxide, zinc tin oxide, indium oxide, zinc oxide, tin oxide or a combination thereof. The metal layer may include at least one compound selected from gold, silver, aluminum, copper, nickel, platinum, magnesium, chromium, tungsten, molybdenum, titanium or a combination thereof.

In exemplary embodiments in which the lower electrode layer 211 includes silver, silver ions may be dissolved in an etchant in the process of etching the lower electrode layer 211. When the etchant containing silver ions contacts aluminum, which has a larger ionization tendency, silver particles may be formed by Galvanic reduction. The silver particles may be transferred to the first electrode 212, may contaminate a strip apparatus, or may cause shorts between tough-sensing electrodes formed in later processes. Therefore, the reliability of the display device may be deteriorated due to the formation of silver particles.

According to an exemplary embodiment, the cladding layer 172 covers an aluminum layer of the connection pads. Therefore, the formation of silver particles and the problems arising therefrom may be prevented. Thus, reliability of a display device may be improved.

Figure 12:
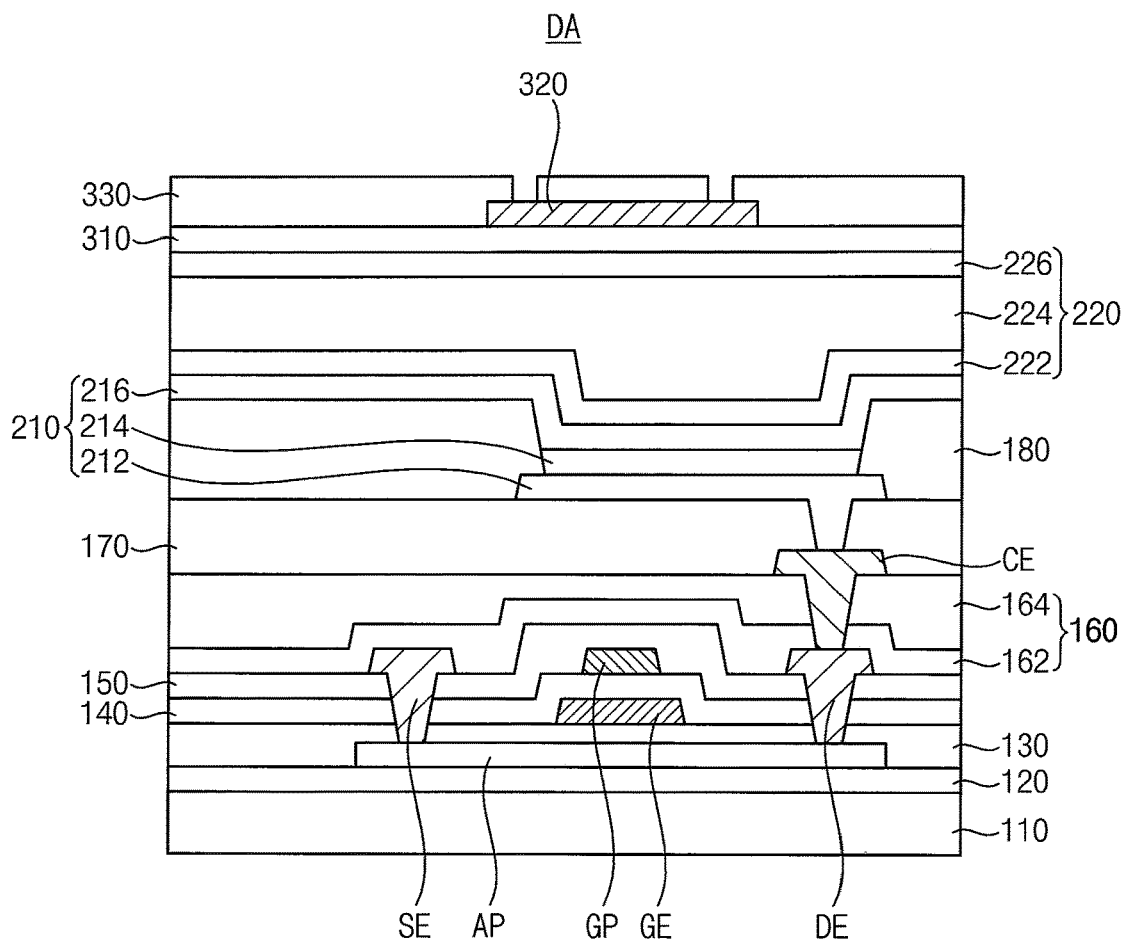
Figure 13:
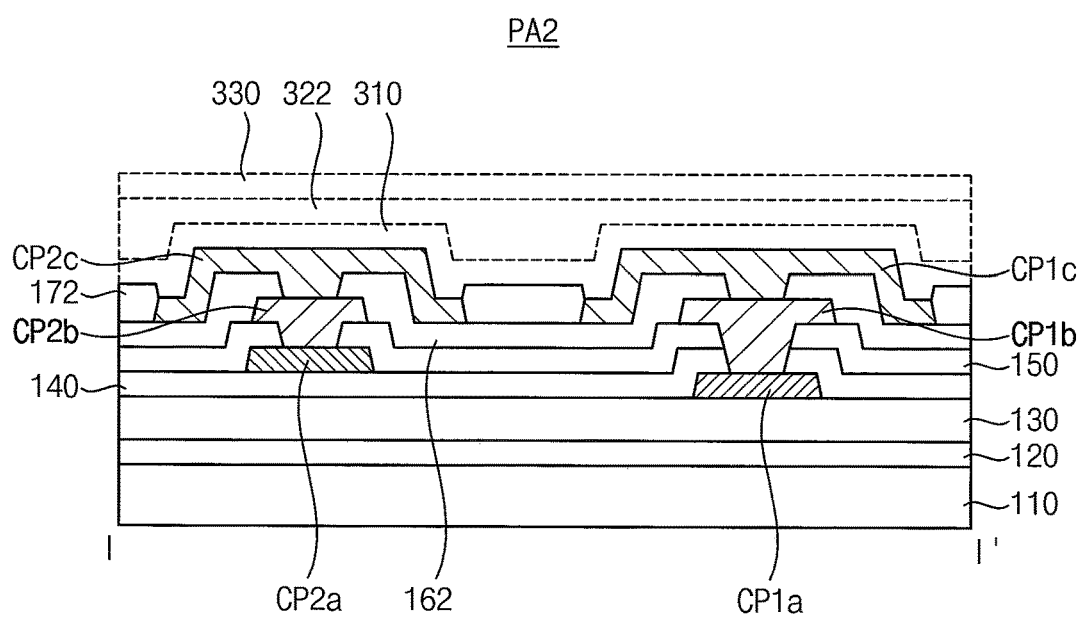

Referring to FIG. 12, a pixel-defining layer 180 is formed in the display area DA. For example, as shown in the exemplary embodiment of FIG. 12, the pixel-defining layer may be formed directly on the first electrode and a top portion of the fifth insulation layer 170. The pixel-defining layer 180 may have an opening exposing at least a portion of the first electrode 212 (e.g., a portion of an upper surface of the first electrode). For example, the pixel-defining layer 180 may include an organic insulation material.

An organic light-emitting layer 214 is formed on the first electrode 212. For example, the organic light-emitting layer 214 may be formed in the opening of the pixel-defining layer 180. However, exemplary embodiments of the present inventive concepts are not limited thereto. For example, in other exemplary embodiments, the organic light-emitting layer 214 may extend over an upper surface of the pixel-defining layer, or may be formed as a common layer extending over a plurality of pixels in the display area DA.

The organic light-emitting layer 214 may include at least a light-emitting layer. In an exemplary embodiment, the organic light-emitting layer 214 may further include at least one of a hole injection layer (HIL), a hole transporting layer (HTL), an electron transporting layer (ETL) and an electron injection layer (EIL). For example, the organic light-emitting layer 214 may include a low molecular weight organic compound or a high molecular weight organic compound.

In an exemplary embodiment, the organic light-emitting layer 214 may emit a red light, a green light or a blue light. In another exemplary embodiment, the organic light-emitting layer 214 may emit a white light. In the embodiment in which the organic light-emitting layer 214 emits a white light, the organic light-emitting layer may have a multi-layered structure including a red-emitting layer, a green-emitting layer and a blue-emitting layer, or a single-layer structure including a mixture of a red-emitting material, a green-emitting material and a blue-emitting material.

A second electrode 216 is formed on the organic light-emitting layer 214. In an exemplary embodiment, the second electrode 216 may be formed as a common layer extending over a plurality of pixels in the display area DA.

In an exemplary embodiment, the second electrode 216 may function as an cathode. For example, the second electrode 216 may be formed as a transmitting electrode or a reflecting electrode according to an emission type of the display device. For example, when the second electrode 216 is a transmitting electrode, the second electrode 216 may include at least one compound selected from lithium (Li), calcium (Ca), lithium fluoride, aluminum, magnesium, indium tin oxide, indium zinc oxide, zinc tin oxide, indium oxide, zinc oxide, tin oxide or a combination thereof.

An encapsulation layer 220 may be disposed on the second electrode 216. For example, the encapsulation layer 220 may have a stacked structure including an organic thin film and an inorganic thin film. For example, as shown in the exemplary embodiment of FIG. 12, the encapsulation layer 220 may include a first inorganic thin film 222, an organic thin film 224 disposed on the first inorganic thin film 222 and a second inorganic thin film 226 disposed on the organic thin film 224. For example, a bottom surface of the first inorganic film may be disposed directly on a top surface of the second electrode 216. A bottom surface of the organic thin film 224 may be disposed directly on a top surface of the first inorganic film 222. A bottom surface of the second inorganic thin film 226 may be disposed directly on a top surface of the organic film 224. However, exemplary embodiments of the present inventive concepts are not limited thereto and the number of inorganic thin film layers and organic thin film layers may vary. For example, the encapsulation layer 220 may include at least two organic thin films and at least three inorganic thin films.

In an exemplary embodiment, the organic thin film 224 may include a cured resin such as polyacrylate, etc. For example, the cured resin may be formed from cross-linking reaction of monomers. For example, the first and second inorganic thin films 222 and 226 may include an inorganic material such as at least one compound selected from silicon oxide, silicon nitride, silicon carbide, aluminum oxide, tantalum oxide, hafnium oxide, zirconium oxide, titanium oxide, etc.

The pixel-defining layer 180, the organic light-emitting layer 214, the second electrode 216 and the encapsulation layer 220 may not be formed in the bonding area PA2, or may be initially formed in the bonding area PA2 and subsequently removed.

In an exemplary embodiment, a touch-sensing part may be formed on the encapsulation layer 220. For example, the touch-sensing part may sense external input by detecting variation of capacitance thereby obtaining coordinate information of the external input.

For example, a lower touch insulation layer 310 may be formed on the encapsulation layer 220. As shown in the exemplary embodiment of FIG. 12, a bottom surface of the lower touch insulation layer 310 may be formed directly on a top surface of the second inorganic thin film 226. A first sensing conductive pattern may be formed on the lower touch insulation layer 310. The first sensing conductive pattern may include a bridge pattern 320. A touch interlayer insulation layer 330 may be formed on the first sensing conductive pattern. For example, as shown in the exemplary embodiment of FIG. 12, the touch interlayer insulation layer 330 may be disposed directly on top surfaces and side surfaces of the bridge pattern 320 and on top surfaces of the lower touch insulating layer 310. At least one via hole may be formed through the touch interlayer insulation layer 330 to expose the bridge pattern 320. For example, in the exemplary embodiment shown in FIG. 12, two via holes are formed through the touch interlayer insulation layer 330 to expose the bridge pattern 320. However, exemplary embodiments of the present inventive concepts are not limited thereto.

In an exemplary embodiment, the lower touch insulation layer 310, a first touch conductive layer 322 for forming the first sensing conductive pattern and the touch interlayer insulation layer 330 may not be formed or may be formed and then removed in the bonding area PA2.

Figure 14:
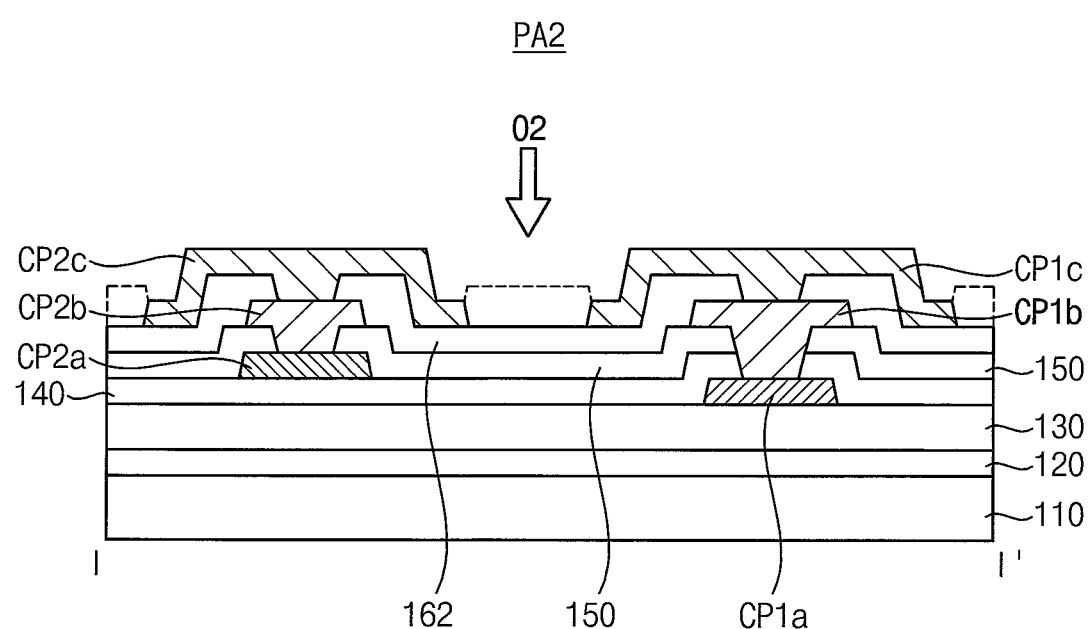

Referring to FIG. 14, the cladding layer 172 is removed in the bonding area PA2 as indicated by the broken lines in FIG. 14 representing the removed cladding layer. In an exemplary embodiment, the cladding layer 172 may be removed by an ashing process using oxygen gas or the like. However, exemplary embodiments of the present inventive concepts are not limited thereto. Thus, side surfaces of the second intermediate conductive layers CP1c and CP2c may be exposed.

Figure 15:
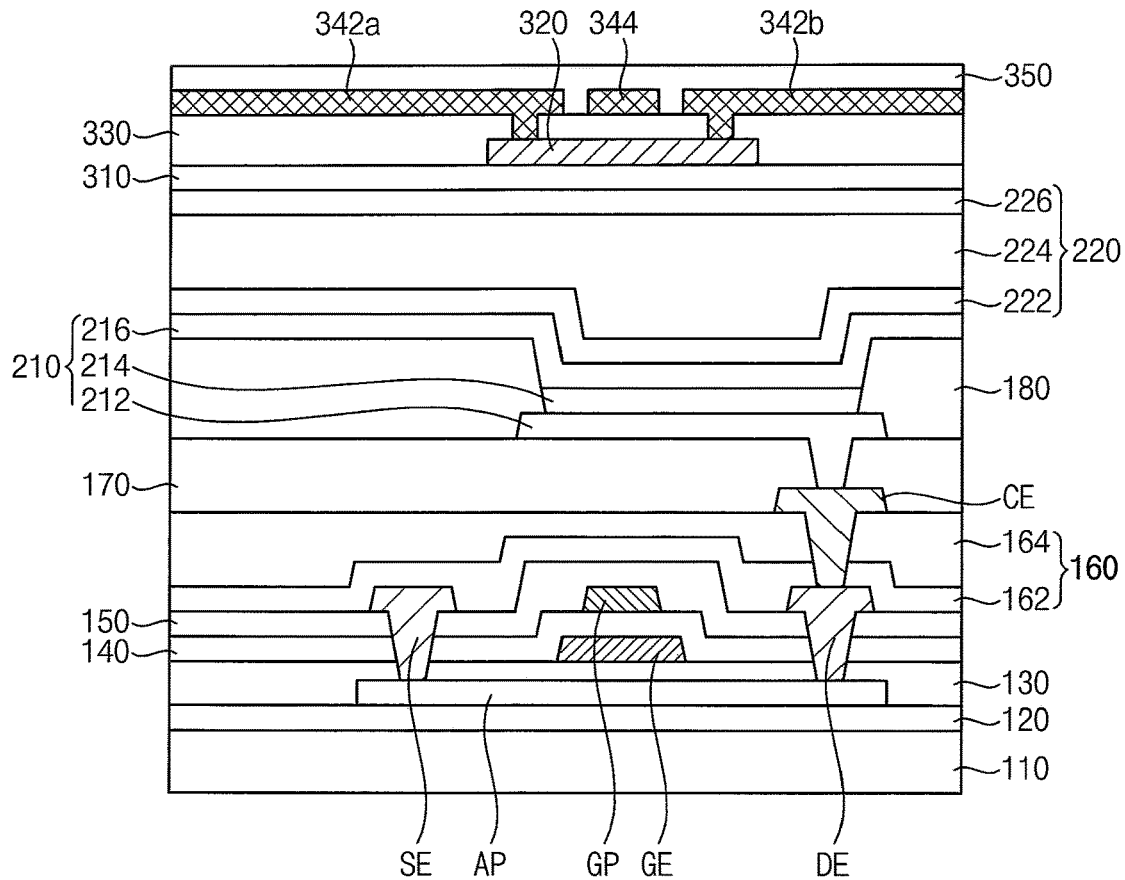

Referring to FIG. 15, a second sensing conductive pattern may be formed on the touch interlayer insulation layer 330 in the display area DA.

The second sensing conductive pattern may include a first touch electrode and a second touch electrode. The first touch electrode may be electrically insulated from the second touch electrode. For example, the first touch electrode may include an array of electrode patterns arranged along a first direction. The second touch electrode may include an array of electrode patterns arranged along a second direction crossing the first direction.

For example, the first touch electrode may include a first electrode pattern 342a and a second electrode pattern 342b, which are spaced apart from each other along a direction parallel to an upper surface of the base substrate 110. The first electrode pattern 342a and the second electrode pattern 342b may electrically contact the bridge pattern 320 through the via holes of the touch interlayer insulation layer 330. Thus, the first electrode pattern 342a and the second electrode pattern 342b may be electrically connected to each other.

The second touch electrode may include a plurality of electrode patterns and a connection portion 344 disposed in a same layer as the electrode patterns and continuously connected to the electrode patterns.

A touch protective layer 350 may be formed on the second sensing conductive pattern. For example, as shown in the exemplary embodiment of FIG. 15, a bottom surface of the touch protective layer 350 is disposed directly on a top surface of the touch protective layer 350.

Figure 16:
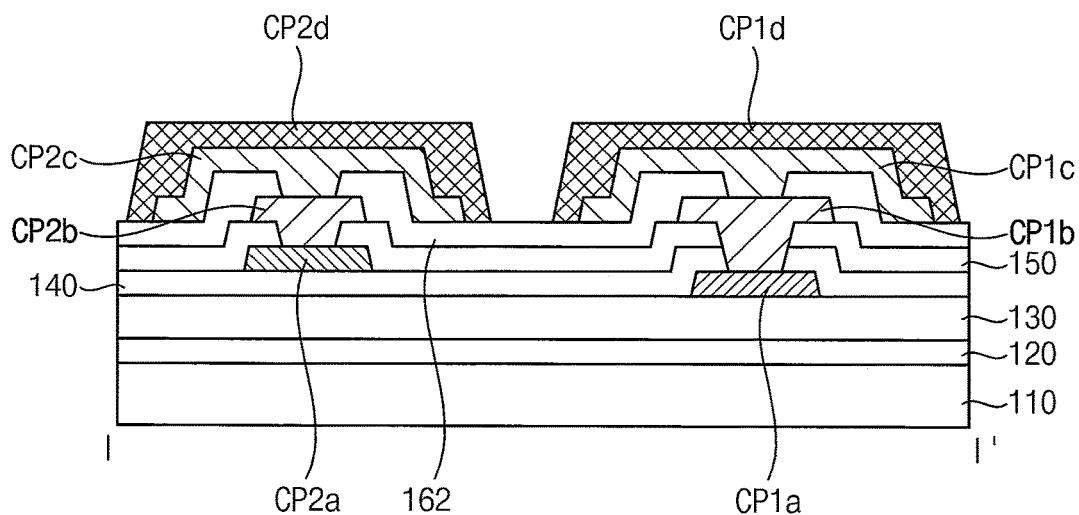

Referring to FIG. 16, upper conductive layers CP1d and CP2d of the first and second connection pads are formed on the second intermediate conductive layers CP1c and CP2c of the first and second connection pads in the bonding area PA2.

In an exemplary embodiment, the upper conductive layers CP1d and CP2d of the first and second connection pads may be formed from a same layer as the second sensing conductive pattern. The upper conductive layers CP1d and CP2d of the first and second connection pads may directly contact a portion of an upper surface and side surface of the second intermediate conductive layers CP1c and CP2c of the first and second connection pads, respectively, without an intermediate member (e.g., an insulation layer, etc.) interposed therebetween. For example, as shown in the exemplary embodiment of FIG. 16, the upper conductive layers CP1d and CP2d may directly contact and cover the entire upper surface and the lateral side surfaces of the second intermediate conductive layers CP1c and CP2c of the first and second connection pads, respectively.

The lower touch insulation layer 310 and the touch interlayer insulation layer 330 may respectively include an inorganic insulation material. For example, in an exemplary embodiment, the lower touch insulation layer 310 and the touch interlayer insulation layer 330 may respectively include at least one compound selected from silicon oxide, silicon nitride, silicon carbide or a combination thereof. Furthermore, the lower touch insulation layer 310 and the touch interlayer insulation layer 330 may include an insulating metal oxide such as at least one compound selected from aluminum oxide, tantalum oxide, hafnium oxide, zirconium oxide, titanium oxide, etc. In an exemplary embodiment, the lower touch insulation layer 310 and the touch interlayer insulation layer 330 may include silicon nitride.

The first sensing conductive pattern and the second sensing conductive pattern include a conductive material. For example, the first sensing conductive pattern and the second sensing conductive pattern may respectively include a metal, a conductive metal oxide, a conductive polymer, graphene, carbon nano tube or a combination thereof. In an exemplary embodiment, the metal may include at least one compound selected from molybdenum, silver, titanium, copper, aluminum or an alloy thereof. For example, the metal may be provided to have a shape of continuous thin film or nano wire. In an exemplary embodiment, the conductive metal oxide may be at least one compound selected from indium tin oxide, indium zinc oxide, zinc tin oxide, indium oxide, zinc oxide, tin oxide or a combination thereof. The first sensing conductive pattern and the second sensing conductive pattern may respectively have a single-layered structure or a multi-layered structure including different materials.

In an exemplary embodiment, the upper conductive layers CP1d and CP2d may be formed from a same layer as the second sensing conductive pattern. However, exemplary embodiments of the present inventive concepts are not limited thereto. For example, the upper conductive layers CP1d and CP2d may be formed from a same layer as the first sensing conductive pattern, or may have a multi-layered structure in which they are formed from the same layers as both the first sensing conductive pattern and the second sensing conductive pattern. In another exemplary embodiment, the connection pads may not include the upper conductive layers CP1d and CP2d of the first and second connection pads formed from a touch conductive layer. Thus, the second intermediate conductive layers CP1c and CP2c may function as the upper conductive layers which are connected to a conductive bonding member.

Figure 17:
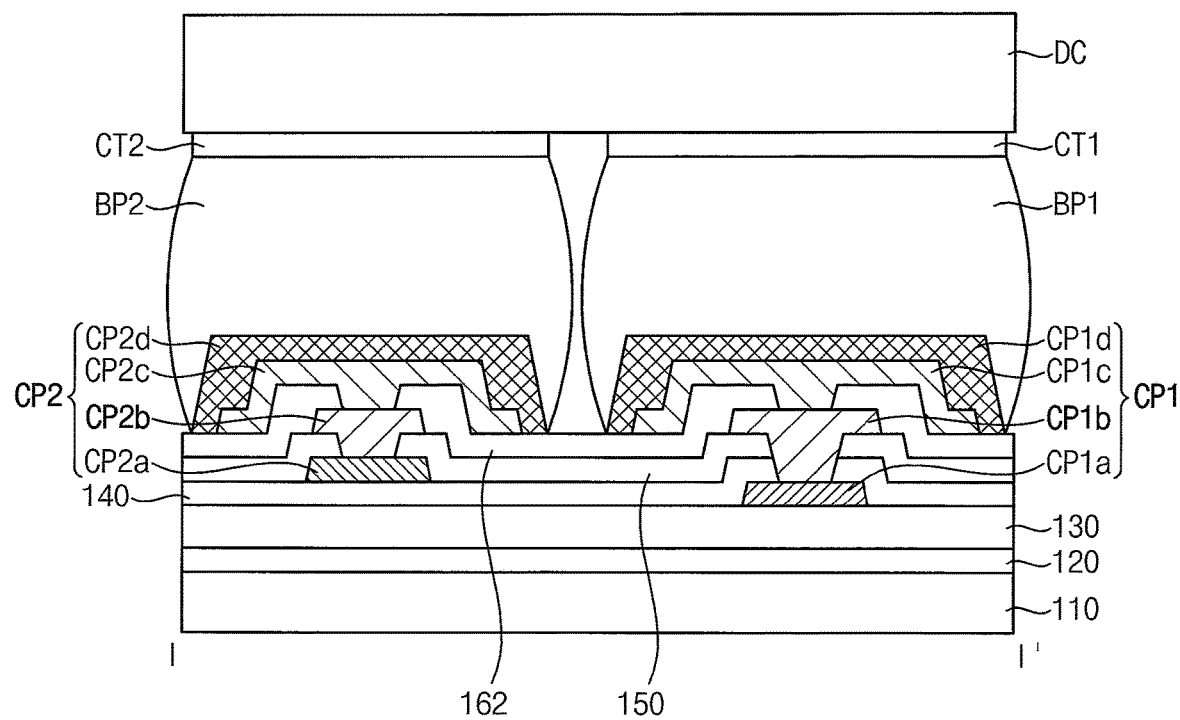

Referring to FIG. 17, a driving part DC including a driving chip may be bonded on the bonding area PA2. In an exemplary embodiment, the driving part DC may be bonded and electrically connected to the first and second connection pads CP1 and CP2 by conductive bonding members BP1 and BP2. As shown in the exemplary embodiment of FIG. 17, a bottom surface of the conductive bonding members BP1 and BP2 may directly contact top surfaces of the upper conductive layers CP1d and CP2d of the first and second connection pads, respectively. The top surfaces of the conductive bonding members BP1 and BP2 may contact a bottom surface of connection terminals of the first and second connection pads CT1 and CT2, respectively. A top surface of the connection terminals of the first and second connection pads CT1 and CT2 directly contacts a bottom surface of the driving part DC. In an exemplary embodiment, the conductive bonding members BP1 and BP2 may be metal bumps. However, exemplary embodiments of the present inventive concepts are not limited thereto. In another exemplary embodiment, an anisotropic conductive film including conductive balls or the like may be used for a conductive bonding member. The conductive bonding members BP1 and BP may be electrically connected to the connection pads CP1 and CP2 and connection terminals CT1 and CT2 of the driving part DC to transfer driving signals to the first and second connection pads CP1 and CP2 from the driving part DC.

In an exemplary embodiment, the cladding layer 172 is formed in the bonding area PA2 to prevent exposure of a conductive layer including aluminum. Therefore, particles due to reduction of metal ions may be prevented. Furthermore, the cladding layer 172 includes an organic material, which is susceptible to heat and moisture, is removed in the process of forming a touch-sensing part before a bonding process. Therefore, a bonding failure may be prevented, and a size of a bonding contact surface may be increased. Thus, a reliability of a display device may be improved.

Figure 18:
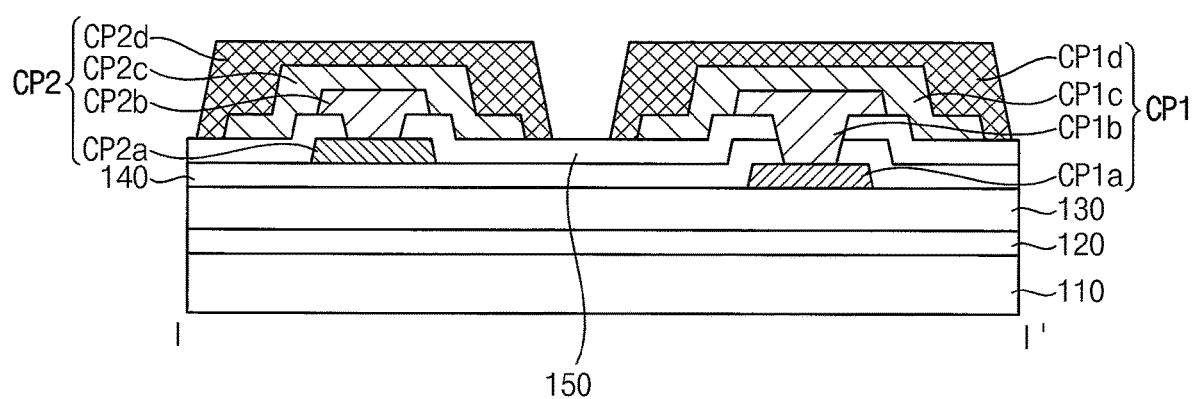
FIGS. 18 to 20 are cross-sectional views illustrating a bonding area of a display device taken along line I-I' of FIG. 2 for a method for manufacturing a display device according to exemplary embodiments of the present inventive concepts.
Figure 19:
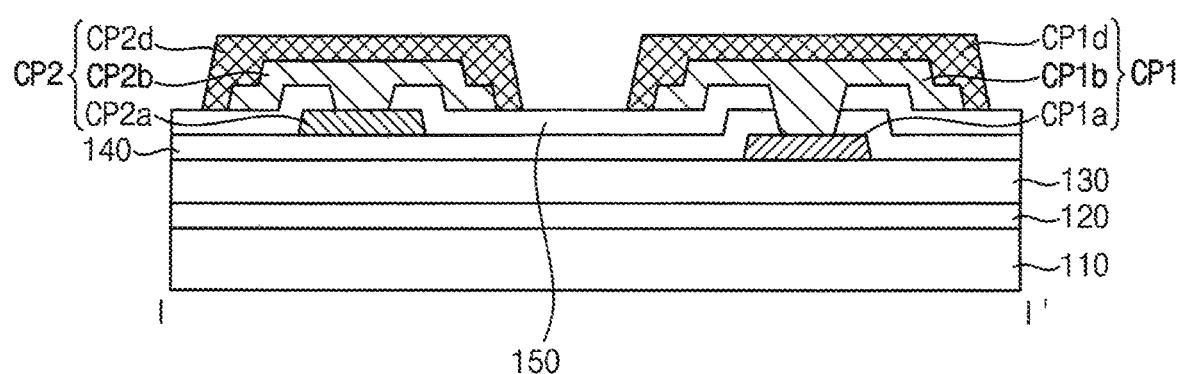
Figure 20:
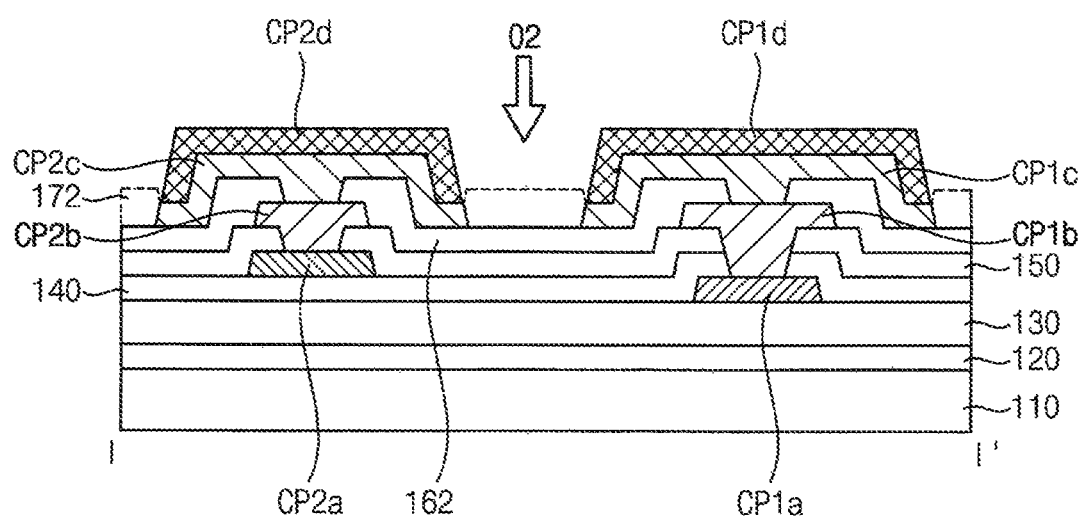

FIGS. 18 to 20 are cross-sectional views illustrating a bonding area of a display device according to exemplary embodiments.

Referring to FIG. 18, first and second connection pads CP1 and CP2 disposed in a bonding area PA2 respectively includes lower conductive layers CP1a and CP2a, first intermediate conductive layers CP1b and CP2b, second intermediate conductive layers CP1c and CP2c and upper conductive layers CP1d and CP2d. The lower conductive layers CP1a and CP2a of the first and second connection pads may be formed from a same layer as a first gate metal pattern or a second gate metal pattern that is formed in a display area DA. The first intermediate conductive layers CP1b and CP2b of the first and second connection pads may be formed from a same layer as a first source metal pattern disposed in the display area DA. The second intermediate conductive layers CP1c and CP2c of the first and second connection pads may be formed from a same layer as a second source metal pattern disposed in the display area DA. The upper conductive layers CP1d and CP2d of the first and second connection pads may be formed from a same layer as a sensing conductive pattern of a touch-sensing part disposed in the display area DA.

In an exemplary embodiment, an insulation layer is not disposed between the first intermediate conductive layers CP1b and CP2b of the first and second connection pads and the second intermediate conductive layers CP1c and CP2c of the first and second connection pads. The second intermediate conductive layers CP1c and CP2c of the first and second connection pads respectively directly contact and cover side surfaces and upper surfaces of the first intermediate conductive layers CP1b and CP2b. For example, an inorganic layer 162 of the fourth insulation layer as shown in the exemplary embodiment of FIG. 17 or any another layer may not be disposed between the second intermediate conductive layers CP1c and CP2c of the first and second connection pads and the first intermediate conductive layers CP1b and CP2b of the first and second connection pads. Therefore, contact of the first intermediate conductive layers CP1b and CP2b with silver ions in an etchant may be prevented even without an insulation layer covering the first intermediate conductive layers CP1b and CP2b. Thus, galvanic reduction of the silver ions and generation of silver particles therefrom may be prevented.

Furthermore, side surfaces of the second intermediate conductive layers CP1c and CP2c of the first and second connection pads are covered by a cladding layer to prevent galvanic reduction of the silver ions. The cladding layer may be removed before the upper conductive layers CP1d and CP2d are formed.

Referring to FIG. 19, first and second connection pads CP1 and CP2 disposed in a bonding area PA2 respectively includes lower conductive layers CP1a and CP2a, first intermediate conductive layers CP1b and CP2b and upper conductive layers CP1d and CP2d. The exemplary embodiment of FIG. 19 may not include a second intermediate conductive layer CP1c and CP2c of the first and second connection pads as shown in the exemplary embodiment of FIG. 18. The lower conductive layers CP1a and CP2a of the first and second connection pads may be formed from a same layer as a first gate metal pattern or a second gate metal pattern, which is disposed in a display area DA. The first intermediate conductive layers CP1b and CP2b of the first and second connection pads may be formed from a same layer as a first source metal pattern disposed in the display area DA. The upper conductive layers CP1d and CP2d may be formed from a same layer as a sensing conductive pattern of a touch-sensing part disposed in the display area DA.

In the process of forming a first electrode of an organic light-emitting diode disposed in the display area DA, side surfaces of the first intermediate conductive layers CP1*b* and CP2*b* are covered by a cladding layer to prevent galvanic reduction of the silver ions. The cladding layer may be removed before the upper conductive layers CP1*d* and CP2*d* are formed thereon.

Referring to FIG. 20, connection pads disposed in a bonding area PA2 respectively includes lower conductive layers CP1*a* and CP2*a*, first intermediate conductive layers CP1*b* and CP2*b*, second intermediate conductive layers CP1*c* and CP2*c* and upper conductive layers CP1*d* and CP2*d*. The lower conductive layers CP1*a* and CP2*a* of the connection pads may be formed from a same layer as a first gate metal pattern or a second gate metal pattern, which is disposed in a display area. The first intermediate conductive layers CP1*b* and CP2*b* of the connection pads may be formed from a same layer as a first source metal pattern disposed in the display area. The second intermediate conductive layers CP1*c* and CP2*c* of the connection pads may be formed from a same layer as a second source metal pattern disposed in the display area. The upper conductive layers CP1*d* and CP2*d* may be formed from a same layer as a sensing conductive pattern of a touch-sensing part disposed in the display area.

In an exemplary embodiment, a cladding layer 172 covering side surfaces of the second intermediate conductive layers CP1*c* and CP2*c* may be removed after the upper conductive layers CP1*d* and CP2*d* are formed.

Thus, the upper conductive layers CP1*d* and CP2*d* may not be formed on the cladding layer 172. Therefore, the widths of the upper conductive layers CP1*d* and CP2*d* (e.g., in the direction parallel to an upper surface of the base substrate 110) of the connection pads may be equal to or less than the widths of the second intermediate conductive layers CP1*c* and CP2*c*. Therefore, the entire lower surfaces of the upper conductive layers CP1*d* and CP2*d* of the connection pads may contact upper surfaces of the second intermediate conductive layers CP1*c* and CP2*c* of the connection pads.

As illustrated in FIGS. 18 to 20, exemplary embodiments may include connections pads with various configurations. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, exemplary embodiments of the present inventive concepts are not limited thereto a display device including a connection pad including an aluminum layer. The connection pad may include various metals or alloys thereof.

Exemplary embodiments of the present inventive concepts may be applied to various display devices. For example, exemplary embodiments may be applied to vehicle-display device, a ship-display device, an aircraft-display device, portable communication devices, display devices for display or for information transfer, a medical-display device, etc.

The foregoing is illustrative of exemplary embodiments of the present inventive concepts and is not to be construed as limiting thereof. Although exemplary embodiments have been described, those skilled in the art will readily appreciate that many modifications are possible in the exemplary embodiments without materially departing from the novel teachings and aspects of the present inventive concepts. Accordingly, all such modifications are intended to be included within the scope of the present inventive concepts. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the present inventive concepts.

What is claimed is:

1. A display device, comprising:
    a light-emitting element disposed in a display area and
    a driving element electrically connected to the light-emitting element;
    an encapsulation layer covering the light-emitting clement;
    a connection pad disposed in a bonding area of a non-display area, the connection pad including a lower conductive layer, an intermediate conductive layer disposed on the lower conductive layer, the intermediate conductive layer includes a first intermediate conductive layer and a second intermediate conductive layer, and an upper conductive layer disposed on the intermediate conductive layer, wherein a lower surface of the upper conductive layer directly contacts an upper surface of the second intermediate conductive layer without an intermediate member disposed therebetween;
    wherein an inorganic layer is disposed between the first intermediate conductive layer and the second intermediate conductive layer.

2. The display device of claim 1, wherein the display device further comprises:
    a touch-sensing part disposed on the encapsulation layer, the touch-sensing part including a sensing, conductive pattern;
    wherein the driving element includes:
    a gate metal pattern including a gate electrode; and
    a source metal pattern including a drain electrode connected to the light-emitting element through a connection electrode.

3. The display device of claim 2, wherein the lower conductive layer is disposed in a same layer as the gate metal pattern, the intermediate conductive layer is disposed in a same layer as the source metal pattern, and the upper conductive layer is disposed in a same layer as the sensing conductive patter.

4. The display device of claim 3, wherein:
    the source metal pattern includes a first source metal pattern including the drain electrode, and a second source metal pattern including the connection electrode,
    wherein the first intermediate conductive layer is disposed in a same layer as the first source metal pattern, and the second intermediate conductive layer is disposed in a same layer as the second source metal pattern.

5. The display device of claim 1, further comprising:
    a touch-sensing part disposed on the encapsulation layer;
    wherein the touch-sensing part includes a first sensing conductive pattern, a touch intermediate insulation layer covering the first sensing conductive pattern, and a second sensing conductive pattern disposed on the touch intermediate insulation layer, and wherein the upper conductive layer is disposed in a same layer as the second sensing, conductive pattern.

6. The display device of claim 1, wherein the upper conductive layer directly contacts and covers an entirety of an upper surface and a side surface of the second intermediate conductive layer.

7. The display device of claim 1, wherein an entire lower surface of the upper conductive layer contacts the second intermediate conductive layer.

8. The display device of claim 1, wherein the intermediate conductive layer includes an aluminum layer and a titanium layer disposed on the aluminum layer.

9. The display device of claim 8, wherein a first electrode of the light-emitting element includes silver.

10. The display device of claim 1, further comprising a driving part bonded to the connection pad, wherein the connection pad is electrically connected to the driving part through at least one conductive bonding member.

11. A method for manufacturing a display, the method comprising:
   forming a light-emitting element disposed in a display area, a driving element electrically connected to the light-emitting element and an encapsulation layer covering the light-emitting element;
   forming a lower conductive layer of a connection pad in a bonding area of a non-display area;
   forming an intermediate conductive layer of the connection pad that is electrically connected to the lower conductive layer;
   forming a cladding layer that covers a side surface of the intermediate conductive layer and exposes an upper surface of the intermediate conductive layer; and
   removing the cladding layer after the light-emitting element and the encapsulation layer are formed.

12. The method of claim 11, wherein:
   the lower conductive layer is formed from a same layer as a gate electrode of the driving element; and
   the intermediate conductive layer is formed from a same layer as a drain electrode or a connection electrode that is configured to electrically connect the drain electrode to the light-emitting element.

13. The method of claim 12, further comprising:
   forming a touch sensing part on the encapsulation layer, the touch-sensing part including a sensing conductive pattern;
   forming an upper conductive layer of the connection pad from a same layer as the sensing conductive pattern, wherein the upper conductive layer directly contacts the intermediate conductive layer.

14. The method of claim 13, wherein:
   the touch-sensing part includes a first sensing conductive pattern, a touch intermediate insulation layer covering the first sensing conductive pattern, and a second sensing conductive pattern disposed on the touch intermediate insulation layer,
   wherein the upper conductive layer is formed from a same layer as the second sensing conductive pattern.

15. The method of claim 13, wherein the cladding layer is removed before the upper conductive layer is formed.

16. The method of claim 13, wherein the cladding layer is removed after the upper conductive layer is formed.

17. The method of claim 12, wherein the firming of the intermediate conductive layer includes forming a first intermediate conductive layer formed from a same layer as the drain electrode, and forming a second intermediate conductive layer formed from a same layer as the connection electrode.

18. The method of claim 11, wherein the intermediate conductive layer includes an aluminum layer and a titanium layer disposed on the aluminum layer, wherein a first electrode of the light-emitting element includes silver.

19. The method of claim 11, wherein the cladding layer includes an organic insulation layer.

20. The method of claim 11, further comprising bonding the connection pad to a driving part through a conductive bonding member.

21. A display device, comprising:
   a light-emitting element disposed in a display area; and
   a connection pad disposed in a bonding area of a non-display area, the connection pad including a lower conductive layer, a first intermediate conductive layer disposed on the lower conductive layer, a second intermediate conductive layer disposed on the first intermediate conductive layer, and an upper conductive layer disposed on the second intermediate conductive layer,
   wherein a lower surface of the second intermediate conductive layer directly contacts and covers an upper surface and side surfaces of the first intermediate conductive layer, and
   wherein a lower surface of the upper conductive layer directly contacts and covers an upper surface and side surfaces of the second intermediate conductive layer and the upper conductive layer does not directly contact the first intermediate conductive layer.

* * * * *